United States Patent
Thiagarajan et al.

(10) Patent No.: US 8,284,084 B1
(45) Date of Patent: Oct. 9, 2012

(54) MICROPROCESSOR CONTROLLED ON-CHIP PROGRAMMABLE REFERENCE SELECTION FOR DATA CONVERTERS

(75) Inventors: Eashwar Thiagarajan, Bothell, WA (US); Harold Kutz, Edmonds, WA (US); Gajender Rohilla, Bothell, WA (US); Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 399 days.

(21) Appl. No.: 12/773,691

(22) Filed: May 4, 2010

Related U.S. Application Data

(60) Provisional application No. 61/175,320, filed on May 4, 2009.

(51) Int. Cl.
*H03M 1/00* (2006.01)
(52) U.S. Cl. .................................... 341/126; 341/155
(58) Field of Classification Search .................. 341/155, 341/156, 126
See application file for complete search history.

(56) References Cited

U.S. PATENT DOCUMENTS

| | | | |
|---|---|---|---|
| 4,989,001 A | 1/1991 | Serev | |
| 6,279,108 B1* | 8/2001 | Squires et al. | 712/244 |
| 6,348,798 B1 | 2/2002 | Daw | |
| 6,545,624 B2* | 4/2003 | Lee et al. | 341/155 |
| 6,686,860 B2* | 2/2004 | Gulati et al. | 341/155 |
| 6,952,621 B1 | 10/2005 | Malcolm, Jr. | |
| 7,068,205 B1 | 6/2006 | Hastings et al. | |
| 7,102,394 B1 | 9/2006 | Wilson et al. | |
| 7,170,308 B1 | 1/2007 | Rahim et al. | |
| 7,233,274 B1 | 6/2007 | Kuhn | |
| 7,413,126 B2 | 8/2008 | Pettinelli et al. | |
| 7,479,913 B1 | 1/2009 | Thiagarajan et al. | |
| 7,504,979 B1 | 3/2009 | Knausz et al. | |
| 7,965,215 B2* | 6/2011 | Rofougaran | 341/155 |

\* cited by examiner

*Primary Examiner* — Jean B Jeanglaude

(57) ABSTRACT

A programmable processing device having a control system and a programmable reference block. The control system sends digital control signals to the programmable reference block, which in turn generates analog variable signals used as reference signals for the programming of the one or more reconfigurable data converters.

20 Claims, 3 Drawing Sheets

MICROPROCESSOR CONTROLLED ON-CHIP PROGRAMMABLE REFERENCE SELECTION FOR DATA CONVERTERS

CROSS-REFERENCE TO RELATED APPLICATIONS

This application claims the benefit of U.S. Provisional Patent Application No. 61/175,320, filed on May 4, 2009.

TECHNICAL FIELD

This disclosure relates to a processing device and, more particularly, to a programmable reference selection for various types of reconfigurable data converters in a programmable processing device.

BACKGROUND

A programmable processing device can be programmed to handle dozens of data acquisition channels and analog or digital inputs. A programmable processing device typically includes data converters. A data converter, which can be either non-reconfigurable or reconfigurable, is supported by a fixed reference source that supplies either a voltage and/or current reference signal to the data converter.

In order to support various speeds, data resolutions, sampling rates, signal-to-noise ratios, and band-width requirements, different types of reconfigurable data converters are implemented in a programmable processing device. Because different types of reconfigurable data converters impose different reference source restrictions, the fixed reference source in the programmable processing device is not flexible enough to support the different types of reconfigurable data converters.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present disclosure may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present disclosure.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Embodiments of a method and an apparatus are described for a programmable processing device having a control system and a programmable reference block. In one embodiment, the programmable reference block is configured to generate, based on the digital control signals received from the control system, analog variable signals for the various reconfigurable data converters coupled with the programmable reference block. In one embodiment, the control system comprises one or more of a combination of a micro controller, a direct memory access (DMA) controller, and a system resource. In one embodiment, the programmable reference block comprises a digital portion and an analog portion, where the digital portion of the programmable reference block receives the digital control signals generated by the control system, and the analog portion of the programmable reference block generates the analog variable signals that are used as reference signals for the various reconfigurable data converters. In one embodiment, the digital control signals are generated based on the requirements for the reconfigurable data converters coupled to the programmable reference block.

Figure 1:
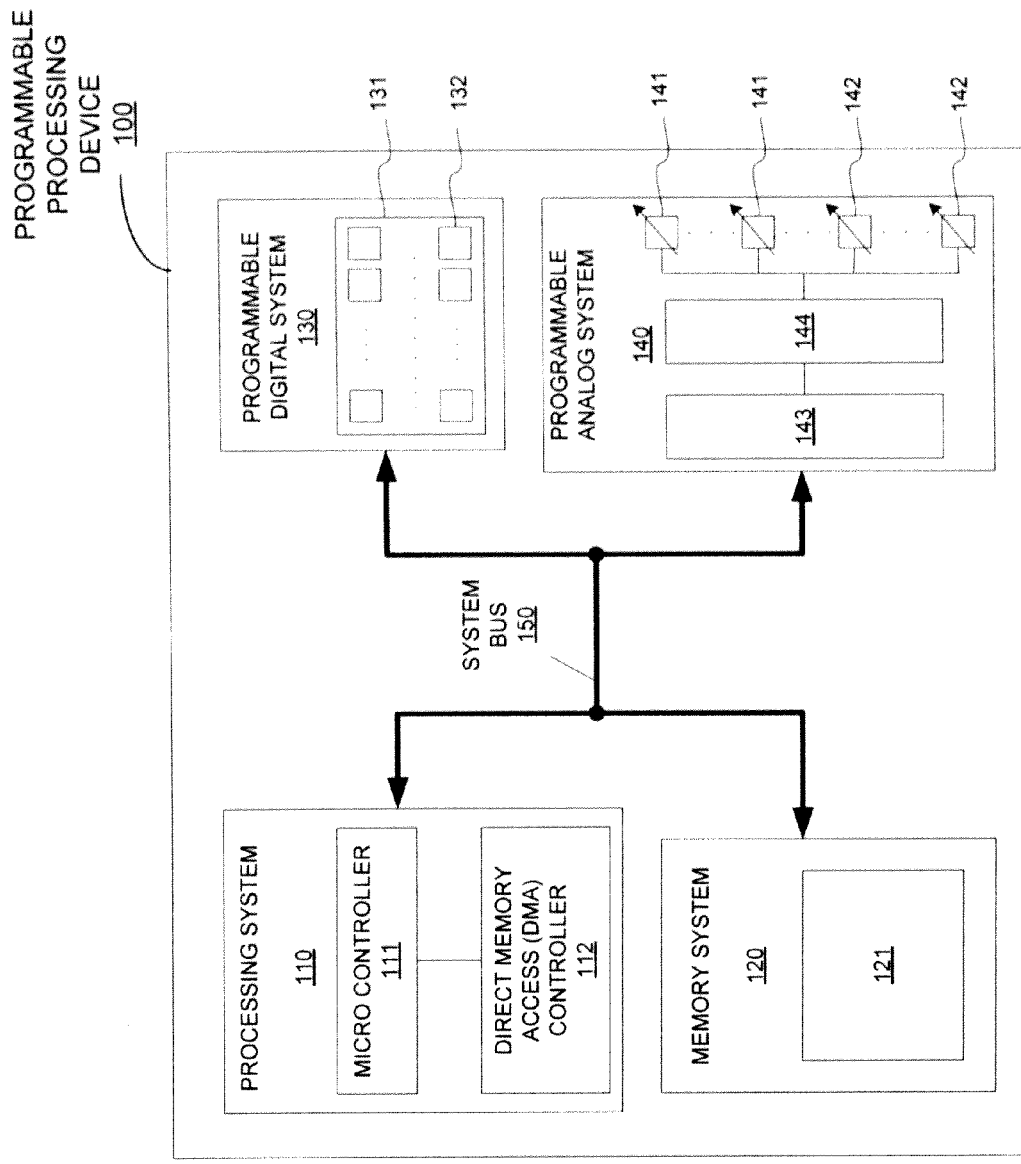
FIG. 1 illustrates a block diagram of one embodiment of a programmable processing device.

FIG. 1 illustrates a block diagram of one embodiment of a programmable processing device 100. The programmable processing device 100 includes a processing system 110, a memory system 120, a programmable digital system 130, and a programmable analog system 140. In one embodiment, the programmable digital system 130 provides digital configurability and may be configured to correspond to the specific digital functions desired by a user. In another embodiment, the programmable analog system 140 provides analog configurability and may be configured to correspond to the specific analog functions desired by a user. The processing system 110, the memory system 120, the programmable digital system 130, and the programmable analog system 140 are coupled together via the system bus 150. In one embodiment, during the initialization phase of the programmable processing device 100, a user can configure or program the programmable digital system 130 and the programmable analog system 140 with chosen configuration data so that the programmable processing device 100 can deliver the user desired functionality.

In one embodiment, the memory system 120 comprises a non-volatile memory 121 for the storage of the software programs running at the programmable processing device 100. In one embodiment, the non-volatile memory 121 is used to store values of various registers in the programmable processing device 100. In one embodiment, the software programs stored in the non-volatile memory 121 may be used to configure the programmable digital system 130 and the programmable analog system 140. In one embodiment, the software programs stored in the non-volatile memory 121 may be used to program the reconfigurable data converters 141 or 142 in the programmable analog system 140. In one embodiment, the values stored in the non-volatile memory 121 may be used as a system resource for the generation of analog reference signals for the various reconfigurable data converters.

In one embodiment, the processing system 110 comprises a micro controller 111 and a DMA controller 112. Alternatively, the processing system 110 described herein may include one or more general-purpose processing devices such as a microprocessor or central processing unit, a microcontroller, or the like, or one or more special-purpose processing devices such as a digital signal processor (DSP), an application specific integrated circuit (ASIC), a field programmable gate array (FPGA), or the like. In an alternative embodiment, for example, the processing system 110 may be a network processor having multiple processors including a core unit and multiple micro engines. Additionally, the processing system 110 may include any combination of general-purpose processing devices and special-purpose processing devices. In one embodiment, the micro controller 111 and the DMA controller 112 work dependent with each other. Alternatively, the micro controller 111 and the DMA controller 112 may work independent of each other.

In one embodiment, the DA controller 112 is responsible for the data transfers between the micro controller 11 and the peripherals of the programmable processing device 100. In one embodiment, the DMA controller 112 is also responsible for the data transfers between the peripherals of the programmable processing device 100. In one embodiment, both the micro controller 111 and the DMA controller 112, being the system bus masters, may initiate data transactions on the system bus 150. In one embodiment, the DMA controller 112 can handle peripheral communication without the intervention from the micro controller 111. In one embodiment, the DMA controller 112 may receive signals from or send signals to system resources located in the memory system 120, the programmable digital system 130, or the programmable analog system 140.

In one embodiment, the programmable digital system 130 is comprised of a universal digital block (UDB) array 131 having a plurality of UDBs 132. In one embodiment, the UDB array is a system resource of programmable processing device 100.

In one embodiment, the programmable analog system 140 comprises a system analog interface logic 143, a programmable reference block 144, and a plurality of reconfigurable analog-to-digital converters (ADCs) and a plurality of digital-to-analog converters (DACs). As shown, the programmable reference block 144 is coupled to both the system analog interface logic 143 and the plurality of ADCs and DACs. The system analog interface logic 143 is coupled to micro controller 111 and the DMA controller 112 via the system bus 150.

Figure 2:
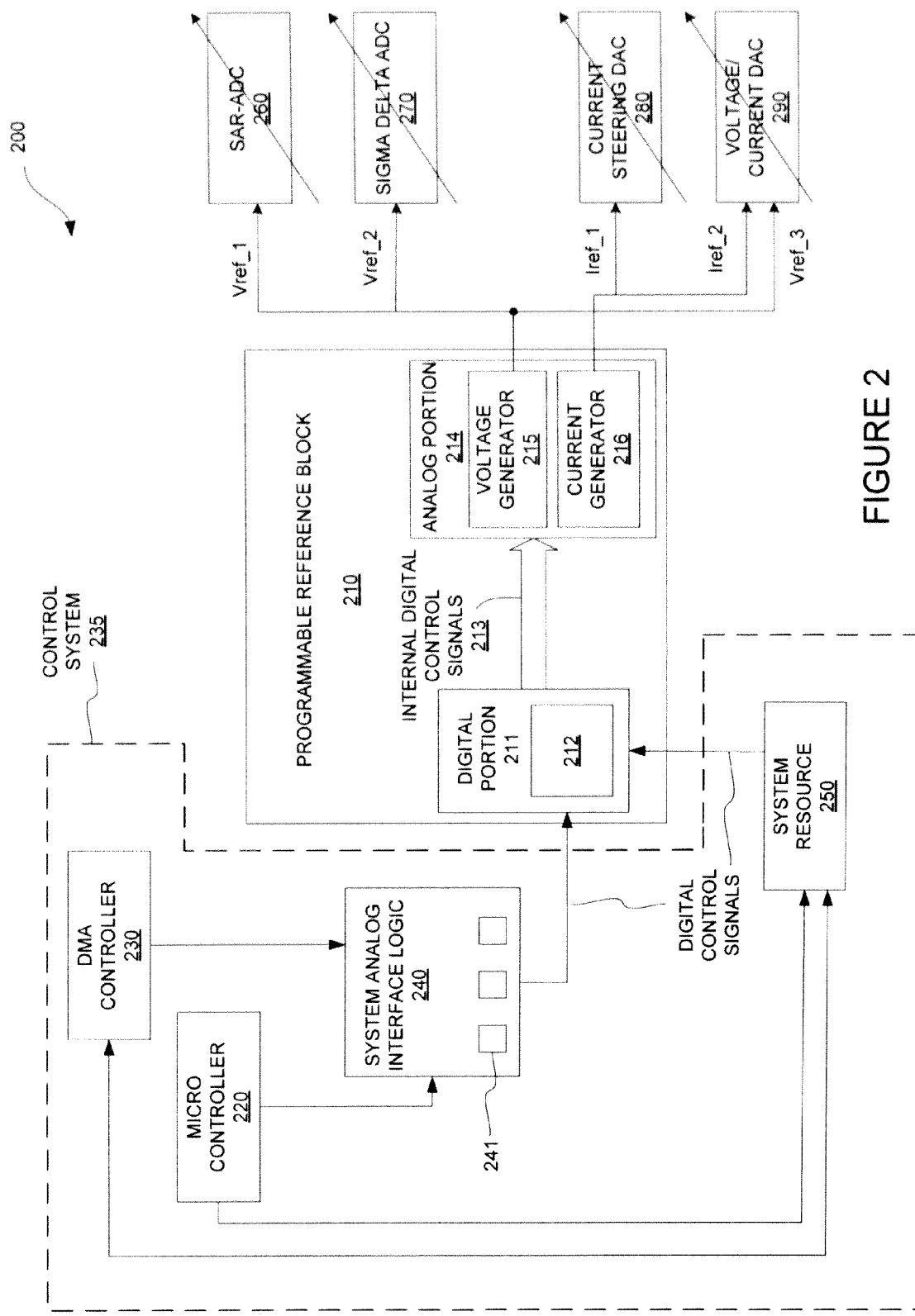
FIG. 2 illustrates a block diagram of one embodiment of a programmable reference block coupled to a control system and reconfigurable data converters in a programmable processing device.

FIG. 2 illustrates a block diagram of one embodiment of a programmable reference block coupled to a control system and reconfigurable data converters in a programmable processing device 200. In one embodiment, the programmable reference block 210 generates analog variable signals that are used as reference signals for the reconfigurable data converters 260 to 290. In one embodiment, the reconfigurable data converters 260 to 290 are located in the programmable processing device 200, i.e., the reconfigurable data converters are on-chip reconfigurable data converters. In another embodiment, the reconfigurable data converters 260 to 290 are located outside of the programmable processing device 200, i.e., the reconfigurable data converters are off-chip reconfigurable data converters. In one embodiment, the control system 235 and the programmable reference block 210 are located inside the programmable processing device 200.

In one embodiment, the control system comprises one or more of a combination of the micro controller 220, the DMA controller 230, and the system resource 250. The control system further comprises a system analog interface logic 240. The system analog interface logic 240 comprises a plurality of registers 241 that are used to receive digital control signals from the micro controller 220 or the DMA controller 230, and to send the digital control signals to the digital portion 211 of the programmable reference block 210.

In one embodiment, the programmable reference block 210 comprises a digital portion 211 and an analog portion 214. In one embodiment, the digital portion 211 of the programmable reference block 210 is used to receive digital control signals sent by the control system 235. The digital portion 211 of the programmable reference block 210 is used to generate the internal digital control signals 213 that are used to control the analog portion 214 of the programmable reference block 210. In one embodiment, the internal digital control signals 213 are static for a given state of configuration requirements for one or more reconfigurable data converters. Alternatively, the internal digital control signals 213 may be dynamic based on the requirements of the system level applications for the one or more reconfigurable data converters. The analog portion 214 of the programmable reference block 210 is used to generate analog variable signals, which are applied to the reconfigurable data converters as reference signals. In one embodiment, the analog variable signals are voltage signals or current signals, which can be applied as the reference signals for the on-chip or off-chip reconfigurable data converters.

In one embodiment, the programmable reference block 210 is coupled to two ADCs (260 and 270) and two DACs (280 and 290). Each of the two ADCs 260 and 270 converts continuous analog voltage or current signals to the discrete digital signals proportional to the magnitudes of the received voltage or current signals. On the other hand, each of the two DACs 280 and 290 converts discrete digital signals to continuous analog voltage or current signals. In one embodiment, each of the reconfigurable data converters 260 to 290 is reconfigurable in terms of the bits resolutions, output data rates, input referred noise, and power consumptions. In one embodiment, each of the reconfigurable data converters may be reconfigured for M bits at K Msps, where both M and K are variables, and Msps stands for mega sample per second. Although FIG. 2 only shows four types reconfigurable data converters, the disclosed embodiments support other types of data converters with different reconfigurabilities.

As shown in FIG. 2, in one embodiment, the programmable reference block 210 is used to generate the voltage reference signals Vref_1, Vref_2, and Vref_3 to the SAR-ADC 260, the Sigma Delta ADC 270, and the Voltage/Current DAC 290, respectively. In one embodiment, the programmable reference block 210 is used to generate the current reference signals Iref_1 and Ierf_2 to the Current Steering DAC 280 and the Voltage/Current DAC 290, respectively.

In one embodiment, the micro controller 220 transfers data or digital control signals from the memory system of the programmable processing device (not shown), via the system analog interface logic 240, to the digital portion 211 of the programmable reference block 210. In one embodiment, the DMA controller 230 transfers data or digital control signals from the memory system of the programmable processing device (not shown) and the system resource 250, via the system analog interface logic 240, to the digital portion 211 of the programmable reference block 210. In one embodiment, the system resource 250 directly transmits digital control signals to the digital portion 211 of the programmable reference block 210. In another embodiment, the system resource 250 transfers resource signals to the DMA controller 230, which in turn sends the digital control signals via the system analog interface logic 240 to the digital portion 211 of the programmable reference block 210. In one embodiment, the digital portion 211 of the programmable reference block 210 receives the digital control signals from the combination of the micro controller 220, the DMA controller 230, and the system resource 250.

Upon receiving the digital control signals, the digital portion 211 of the programmable reference block 210 generates the internal digital control signals 213 to control the analog portion 214 of the programmable reference block 210 so that the analog portion 214 of the programmable reference block 210 can generate the analog variable signals (e.g., the voltage signal Vref and the current signal Iref) that meet the dynamic requirements for the reconfigurable ADCs or DACs. In one embodiment, the requirements for the reconfigurable ADCs or DACs are power consumption, bits resolutions, output data rates, input referred noise requirements. The requirements for the reconfigurable data converters vary from one user data converter application to another. In one embodiment, the requirements for the reconfigurable data converters are received through the user data converter applications running at the programmable processing device 200. In one embodiment, the power consumed by the analog portion 214 of the programmable reference block 210 depends on the data converter application.

In one embodiment, the programmable reference block 210 comprises a digital portion 211 and an analog portion 214, where the digital portion 211 is configured to receive the digital control signals from the control system 235, and the analog portion 214 is configured to generate the analog variable signals. In one embodiment, the analog variable signals are voltage signals and current signals. In one embodiment, the voltage signals are Vref_SAR received by the SAR-ADC 270, Vref_DSM&VCM received by the Sigma Delta ADC 280, and Vref_DAC2 received by the Voltage/Current DAC 290. In one embodiment, the current signals are Iref_DAC received by the Current Steering DAC 280 and Iref_DAC2 received by the Voltage/Current DAC 290.

In one embodiment, the digital portion 211 of the programmable reference block 210 comprises a combination of logic 212, such as logic gates, control switches, and enable signals to the analog portion 214 of the programmable reference block 210. In one embodiment, analog portion 214 of the programmable reference block 210 comprises a voltage generator 215 and a current generator 216, where the voltage generator 215 is used to generate the voltage signals and the current generator 216 is used to generate the current signals. The voltage generator 215 and the current generator 216 are coupled to the digital portion 211 of the programmable reference block and to the one or more reconfigurable data converters 260 to 290.

In one embodiment, the voltage signal may be used as the reference voltages for the reconfigurable data converters or some other functional voltage signals, such as the voltage signal used for the output common mode of the opamps in a reconfigurable data converters. In one embodiment, the analog variable signals generated by the analog portion 214 of the programmable reference block 210 may be used as reference signals to other components in the programmable processing device 200 or other reconfigurable data converters located outside of the programmable processing device 200. In one embodiment, the system resource 250 comprises one or more of a UDB array, values stored in a memory, state machine logic, fixed function blocks, digital interconnect, look up tables, timers, and counters.

Figure 3:
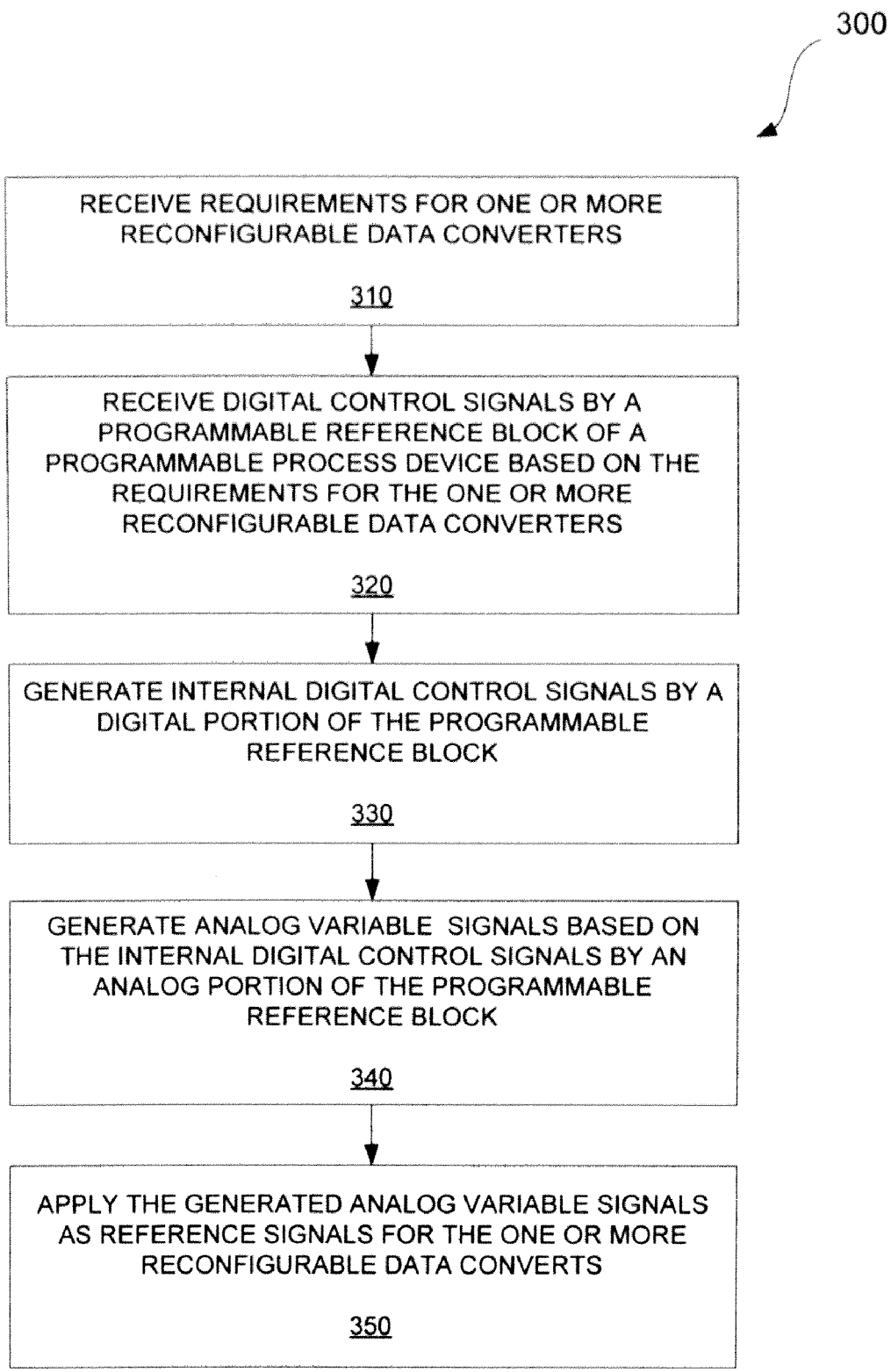
FIG. 3 is a flowchart showing one embodiment of a method of programming one or more reconfigurable data converters in a programming processing device.

FIG. 3 is a flowchart 300 showing a method of programming one or more reconfigurable data converters in a programming processing device.

In block 310, the requirements for one or more the reconfigurable data converters are received. In one embodiment, the requirements for the one or more the reconfigurable data converters are received via a user data converter application program running at the programmable processing device. In one embodiment, the requirements for the one or more reconfigurable data converters comprise the bits resolutions, the output data rates, the input referred noise, the impedances, and the power consumptions of the one more reconfigurable data converters.

In block 320, digital control signals are sent to a programmable reference block. In one embodiment, the digital control signals are sent by a control system. In one embodiment, the control system comprises one or more of a combination of a micro controller, a DMA controller, and a system resource. In one embodiment, the source resource comprises one or more of the look up table of the programmable processing device, the state machine logic of the programmable processing device, the fixed function blocks of the programmable processing device, the values of registers stored in the memory of the programmable processing device, the digital interconnect of the programmable processing device, and the programmed UDBs in the UDB array of the programmable processing device. In one embodiment, the digital control signals are sent to a digital portion of the programmable reference block.

In block 330, internal digital control signals are generated by the digital portion of the programmable reference block, upon receiving the digital control signals in the digital portion of the programmable reference block. In one embodiment, the internal digital control signals are used to control the analog variable signals generated by the analog portion of the programmable reference block. In block 340, the analog variable signals are generated by the analog portion of the programmable reference block. In one embodiment, the analog variable signals are voltage signals or current signals. In block 350, the generated analog variable signals are applied as the reference signals for the programming of the one or more reconfigurable data converters.

The disclosed embodiments provide the ability for the programmable processing device to provide high precision on-chip reference signals for the on chip or off-chip reconfigurable data converters. The disclosed embodiments further provide the ability to provide off-chip filtering of on-chip reference for low noise consideration.

Embodiments, described herein, include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable storage medium. These instructions may be used to program a general-purpose or special-purpose processor to perform the described operations. The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
a control system; and
a programmable reference block coupled to the controller system,
wherein the programmable reference block is configured to generate, based on digital control signals received from the control system, analog variable signals that are used as reference signals for one or more reconfigurable data converters.

2. The apparatus of claim 1, wherein the control system comprises one or more of a combination of a micro controller, a direct memory access (DMA) controller, and a system resource.

3. The apparatus of claim 2, wherein the system resource comprise one or more of universal digital blocks (UDBs), values stored in memory, state machine logic, digital interconnect, and look up tables.

4. The apparatus of claim 2, wherein the programmable reference block comprises a digital portion and an analog portion, wherein the digital portion of the programmable reference block is configured to receive the digital control signals from the control system and the analog portion is configured to generate the analog variable signals based on requirements for the one or more reconfigurable data converters coupled to the analog portion of the programmable reference block.

5. The apparatus of claim 4, wherein the analog variable signals comprise a voltage signal and a current signal.

6. The apparatus of claim 4, further comprising:
a system analog interface logic coupled to the micro controller, the DMA controller, and the digital portion and the analog portion of the programmable reference block, wherein the system analog interface logic is configured to receive signals from the micro controller and the DMA controller and to generate outputs to be received by the digital portion and the analog portion of the programmable reference block.

7. The apparatus of claim 6, wherein the digital portion of the programmable reference block receives the digital control signals from the micro controller via the system analog interface logic.

8. The apparatus of claim 6, wherein the digital portion of the programmable reference block receives the digital control signals from the DMA controller via the system analog interface logic.

9. The apparatus of claim 6, wherein the system resource is coupled to the DMA controller and is configured to send resource signals to the DMA controller that in turn sends the digital control signals via the system analog interface logic to the digital portion of the programmable reference block.

10. The apparatus of claim 4, wherein the digital portion of the programmable reference block is configured to generate internal digital control signals to the analog portion of the programmable reference block, wherein the internal digital control signals are static for a given configuration of the one or more reconfigurable data converters, or dynamic based on requirements of system level applications.

11. The apparatus of claim 4, wherein the digital portion of the programmable reference block receives the digital control signals from the system resource.

12. The apparatus of claim 4, wherein the analog portion of the programmable reference block comprises a voltage generator and a current generator, wherein the voltage generator and the current generator are coupled to the digital portion of the programmable reference block and to the one or more reconfigurable data converters.

13. The apparatus of claim 1, wherein the one or more reconfigurable data converters are reconfigurable analog-to-digital converters (ADCs) or digital-to-analog converters (DACs).

14. The apparatus of claim 1, wherein the control system is configured to send the digital control signals to the programmable reference block based on requirements for the one or more reconfigurable data converters.

15. The apparatus of claim 1, wherein the one or more reconfigurable data converters are either on-chip or off-chip reconfigurable data converters.

16. A method, comprising:
receiving, by a programmable reference block of a programmable process device, digital control signals based on requirements for one or more reconfigurable data converter; and
generating analog variable signals that are used as reference signals for the one or more reconfigurable data converters.

17. The method of claim 16, further comprising:
generating internal digital control signals by a digital portion of the programmable reference block; and
generating the analog variable signals based on the internal digital control signals by an analog portion of the programmable reference block.

18. The method of claim 17, wherein the generating the analog variable signals further comprising:
generating a voltage signal based on the internal digital control signals;
and
generating a current signal based on the internal digital control signals.

19. An apparatus, comprising:
means for receiving, by a programmable reference block of a programmable process device, digital control signals based on requirements for one or more reconfigurable data converter; and
means for generating analog variable signals that are used as reference signals for the one or more reconfigurable data converters.

20. The apparatus of claim 19, further comprising:
means for generating internal digital control signals by a digital portion of the programmable reference block; and
means for generating the analog variable signals based on the internal digital control signals by an analog portion of the programmable reference block.

* * * * *